United States Patent
Boyko et al.

(10) Patent No.: US 6,931,726 B2
(45) Date of Patent: Aug. 23, 2005

(54) METHOD OF MAKING AND INTERCONNECT STRUCTURE

(75) Inventors: Christina M. Boyko, Endicott, NY (US); Donald S. Farquhar, Endicott, NY (US); Konstantinos I. Papathomas, Endicott, NY (US)

(73) Assignee: International Business Machines Corporation, Armonk, NY (US)

( * ) Notice: Subject to any disclaimer, the term of this patent is extended or adjusted under 35 U.S.C. 154(b) by 41 days.

(21) Appl. No.: 10/436,592

(22) Filed: May 13, 2003

(65) Prior Publication Data

US 2003/0172525 A1 Sep. 18, 2003

Related U.S. Application Data

(62) Division of application No. 09/978,442, filed on Oct. 16, 2001, now Pat. No. 6,660,945.

(51) Int. Cl.[7] ............................................. H01K 3/10
(52) U.S. Cl. .............................. 29/852; 29/846; 427/97; 427/99
(58) Field of Search ...................... 29/846, 852; 427/97, 427/99

(56) References Cited

U.S. PATENT DOCUMENTS

| | | | | |
|---|---|---|---|---|
| 4,882,454 A | * | 11/1989 | Peterson et al. | 174/252 |
| 5,231,751 A | | 8/1993 | Sachdev et al. | 29/852 |
| 5,479,703 A | | 1/1996 | Desai et al. | 29/852 |
| 5,537,740 A | | 7/1996 | Shirai et al. | 29/852 |
| 5,569,958 A | | 10/1996 | Bloom | 257/698 |
| 5,764,485 A | | 6/1998 | Lebaschi | 361/774 |
| 5,774,340 A | | 6/1998 | Chang et al. | 361/771 |
| 5,792,375 A | | 8/1998 | Farquhar | 216/34 |
| 5,847,327 A | | 12/1998 | Fischer et al. | 174/258 |
| 5,879,787 A | | 3/1999 | Petefish | 428/209 |
| 5,925,206 A | | 7/1999 | Boyko et al. | 156/150 |
| 5,948,533 A | | 9/1999 | Gallagher et al. | 428/418 |
| 6,009,620 A | | 1/2000 | Bhatt et al. | 29/852 |
| 6,015,520 A | | 1/2000 | Appelt et al. | 264/104 |
| 6,051,093 A | | 4/2000 | Tsukahara | 156/251 |
| 6,079,100 A | | 6/2000 | Farquhar et al. | 29/852 |

FOREIGN PATENT DOCUMENTS

| | | |
|---|---|---|
| JP | 4010696 A | 1/1992 |
| JP | 09064231 A | 3/1997 |

* cited by examiner

Primary Examiner—Rick Kiltae Chang
(74) Attorney, Agent, or Firm—William H. Steinberg

(57) ABSTRACT

A method of making an interconnect structure having an increased chip connector pad and plated through hole density is provided. In particular, the method includes the steps of providing a substrate having at least one plated through hole therein, and positioning a first conductive layer and a second conductive layer over the at least one plated through hole on opposing surfaces of the substrate. The method includes positioning a layer of dielectric material thereon on the first conductive layer. The dielectric layer includes at least one aperture selectively positioned directly over the at least one plated through hole. The substrate further includes a metal layer, and at least a pair of conductive layers that can carry signals, and power.

3 Claims, 4 Drawing Sheets

METHOD OF MAKING AND INTERCONNECT STRUCTURE

CROSS REFERENCE TO COPENDING APPLICATION

This application is a divisional application of Ser. No. 09/978,442, filed Oct. 16, 2001, now U.S. Pat. No. 6,660,945.

TECHNICAL FIELD

The present invention relates generally to electronic packaging, and more particularly, to an interconnect structure for mounting a semiconductor chip and method of forming same.

BACKGROUND OF THE INVENTION

As the demand grows in the industry for miniaturized high performance semiconductor packages, the need to manufacture a reliable high density interconnect structure for mounting semiconductors becomes increasingly important. Producing an interconnect structure having the largest number of chip connections over the smallest possible area is an important objective. It is also important to produce a structure capable of providing adequate wiring capabilities to take advantage of the high density connections.

FIG. 1 shows a much enlarged view, in elevation, of a prior art semiconductor chip carrier 10. The chip carrier 10 includes a substrate 12, a plurality of plated through holes 14, and a layer of conductive material 16 positioned on the side wall of each of the plated through holes and on portions of the surface of substrate 12. The conductive material 16 on portions of the surface of substrate 12 form connection pads 18. A first dielectric layer 20 is positioned on the exposed surface of substrate 12 and on portions of the layer of conductive material 16. The first dielectric layer 20 includes interconnection contact areas 22, which facilitate electrical connection of semiconductor chips (not shown), through interconnections (also not shown), to connection pads 18 of the plurality of plated through holes 14.

FIG. 2 shows a top view of a portion of semiconductor chip carrier 10. The connection pads 18 are dogbone shaped and consume a large portion of the surface area on the carrier 10. This is because each interconnection contact area 22, the area upon which the semiconductor chip interconnection is mounted, is offset from its corresponding plated through hole 14. As a result, the density of plated through holes 14 and interconnections between the semiconductor chip and interconnect contact areas 22 for each carrier 10 is limited.

Additionally, due to differences in the coefficient of thermal expansion between the semiconductor chip carrier, the chips and the interconnections therebetween, internal stresses develop within the semiconductor package during thermal cycling, which may eventually lead to interconnection or device failure.

As a result, there exists a need in the industry for a more reliable, compact interconnect structure which overcomes the disadvantages of known structures.

SUMMARY OF THE INVENTION

Accordingly, it is an object of this invention to enhance the art of electronic packaging.

Another object of this invention is to provide an interconnect structure having highly dense spacing between plated through holes and semiconductor chip interconnection contact areas and a method of forming the same.

Yet another object of this invention is to provide an interconnection structure having highly dense spacing between plated through holes and semiconductor chip interconnection contact areas, the interconnection structure including a metal layer between the first and second opposing surfaces of the interconnection structure and first and second non-conductive layers positioned, respectively, between the first opposing surface and the metal layer and between the second opposing surface and the metal layer.

Still yet another object of this invention is to provide such a method and structure that improves reliability and electrical performance.

According to one aspect of the invention, there is provided an interconnect structure comprising a substrate having first and second opposing surfaces and at least one internal side wall defining a through hole within the substrate extending from the first opposing surface to the second opposing surface, a first conductive material positioned on the at least one internal side wall of the substrate, a first conductive layer positioned on a portion of the first surface of the substrate, the first conductive layer having a first layer portion positioned over the through hole and electrically connected to the first conductive material on the internal side wall of the substrate. A second conductive layer is positioned on a portion of the second surface of the substrate, the second conductive layer having a first layer portion positioned over the through hole and electrically connected to the first conductive material on the internal side wall of the substrate, a first dielectric layer positioned on the first conductive layer and the first opposing surface of substrate and having at least one internal side wall defining an aperture in the first dielectric layer, and a second conductive material positioned on the internal side wall of the first dielectric layer and including a portion of the second conductive material positioned on and electrically connected to the first layer portion of the first conductive layer.

According to another aspect of the invention there is provided a method of forming an interconnect structure comprising the steps of providing a substrate having first and second opposing surfaces and at least one internal side wall defining a through hole within the substrate extending from the first opposing surface to the second opposing surface, positioning a first conductive material on the at least one internal side wall of the substrate, positioning a first conductive layer on a portion of the first surface of the substrate, the first conductive layer having a first layer portion positioned over the through hole and electrically connected to the first conductive material on the internal side wall of the substrate. The method includes positioning a second conductive layer on a portion of the second surface of the substrate, the second conductive layer having a first layer portion positioned over the through hole and electrically connected to the first conductive material on internal side wall of substrate, positioning a first dielectric layer on the first conductive layer and the first opposing surface of the substrate and having at least one internal side wall defining an aperture in the first dielectric layer, and positioning a second conductive material on the internal side wall of the first dielectric layer and including a portion of the second conductive material positioned on and electrically connected to the first layer portion of the first conductive layer.

According to yet another aspect of the invention, there is provided an interconnect structure comprising, a substrate having first and second opposing surfaces and at least one internal side wall defining a through hole within the substrate extending from the first opposing surface to the second opposing surface, wherein the substrate includes a metal layer between the first and second opposing surfaces and first and second non-conductive layers positioned, respectively, between the first opposing surface and the metal layer and between the second opposing surface and the metal layer, a first conductive material positioned on the at least one internal side wall of the substrate, a first conductive layer positioned on a portion of the first surface of the substrate, the first conductive layer having a first layer portion positioned over the through hole and electrically connected to the first conductive material on the internal side wall of the substrate. A second conductive layer is positioned on a portion of the second surface of the substrate, the second conductive layer having a first layer portion positioned over the through hole and electrically connected to the first conductive material on the internal side wall of the substrate, a first dielectric layer positioned on the first conductive layer and the first opposing surface of the substrate and having at least one internal side wall defining an aperture in the first dielectric layer, and a second conductive material positioned on the internal side wall of the first dielectric layer and including a portion of the second conductive material positioned on and electrically connected to the first layer portion of the first conductive layer.

The foregoing and other features of the invention will be apparent from the following more particular description of the embodiments of the invention.

BEST MODE FOR CARRYING OUT THE INVENTION

For a better understanding of the present invention, together with other and further objects, advantages and capabilities thereof, reference is made to the following disclosure and appended claims in conjunction with the above described drawings.

Figure 3:
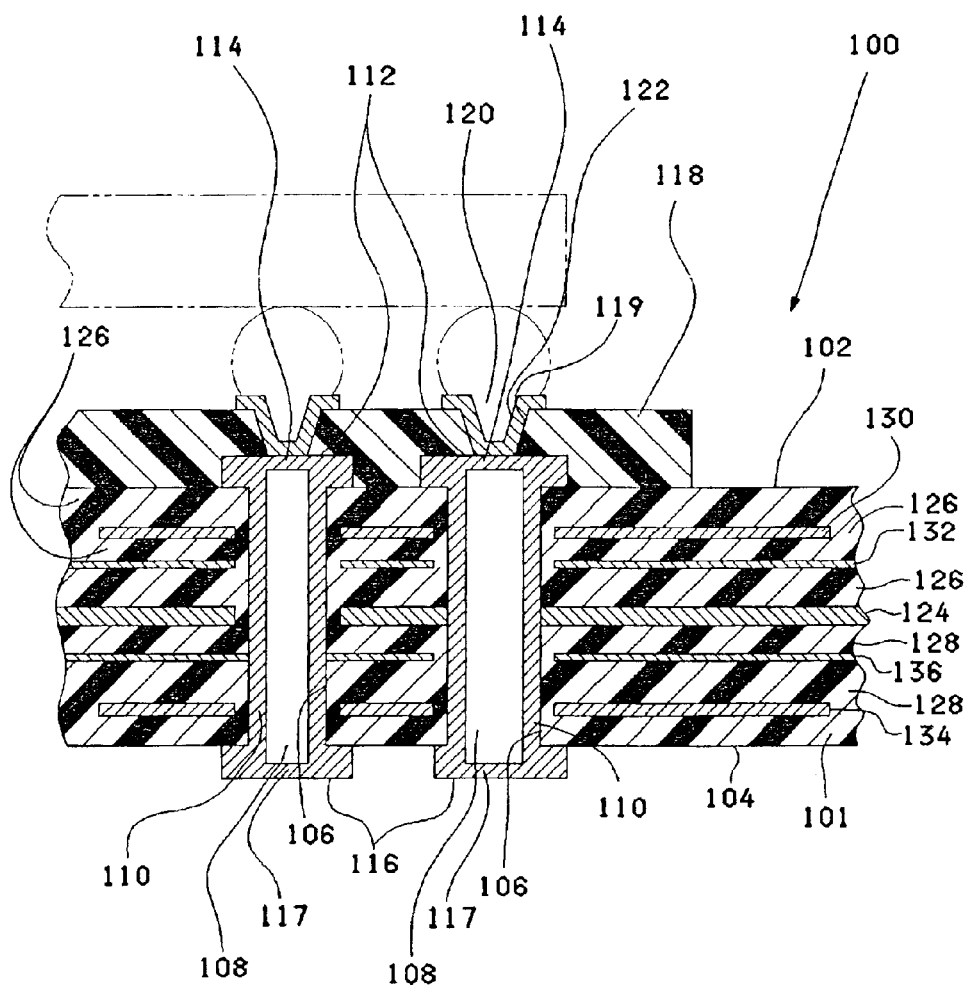
FIG. 3 is a much enlarged view, in elevation, of the interconnect structure of the present invention.

Referring to the drawings, FIG. 3 shows a much enlarged view, in elevation, of the interconnect structure 100 of the present invention comprising a substrate 101 with first and second opposing surfaces 102 and 104, respectively. Substrate 101 includes at least one internal side wall 106 defining a through hole 108 within the substrate. The through hole 108 extends from first opposing surface 102 to second opposing surface 104. A plurality of through holes 108 can be formed within substrate 101 using a hole making process commonly used in the industry, preferably a laser drilling process. The internal side wall 106 is coated with a first conductive material 110. The first conductive material 110 comprises a metal selected from the group consisting of copper, tin, nickel, gold, silver, and alloys thereof, and can be applied by an electroless plating or an electrolytic plating process or a combination thereof.

A first conductive layer 112 is positioned on a portion of first surface 102 of substrate 101. The first conductive layer 112 includes a first layer portion 114 positioned over through hole 108 and is electrically connected to first conductive material 110 on internal side wall 106 of substrate 101. The first layer portion 114 of first conductive layer 112 forms a seal over first conductive material 110 on internal side wall 106 of substrate 101. A second conductive layer 116 is positioned on a portion of second surface 104 of substrate 101. The second conductive layer 116 includes a first layer portion 117 positioned over through hole 108 and is electrically connected to first conductive material 110 on internal side wall 106 of substrate 101. Importantly, first layer portion 114 of first conductive layer 112 and first layer portion 117 of second conductive layer 116 each form a seal over first conductive material 110 on internal side wall 106 of substrate 101. First conductive layer 112 and second conductive layer 116 are each comprised of a metal such as copper, tin, nickel, gold, silver and alloys thereof.

An example of a process for forming a seal over first conductive material 110 and the opening of through hole 108 will be described. A substrate including a through hole and a first conductive material on an internal wall of the through hole was provided. A continuous copper foil was positioned on a first external surface of the substrate so as to be in contact with the first external surface of the substrate and in contact with the first conductive material on the internal wall of the through hole. In this example, the first conductive material was copper. The substrate could be formed from any of variety of commercially available dielectric materials, preferably containing a thermoplastic component, and more preferably from the group of fluorinated polymeric materials containing polytetrafluoroethylene and its copolymers. The substrate provided utilized a particle reinforced polytetrafluoroethylene dielectric material designated as RO-2800 from Rogers Corporation, Rogers Conn.

In preparation for positioning the copper foil on the substrate, both the foil and the first conductive material were prepared using a microetching cleaning step where a relatively dilute etching solution was used to remove oxides and impurities from the copper surfaces. Etching was accomplished using a solution with about 90 to about 130 grams/liter of sodium persulfate including about 1 to about 3 wt % sulfuric acid at room temperature. Other suitable microetchants include hydrogen peroxide, cupric chloride, and ferric chloride. The required removal of a minimum of a about 1 micron of copper, to ensure a clean surface, occurred in about 2 minutes. The foil and substrate were dried for about 2 hours in an oven at 125 degrees Celsius.

After microetching, rinsing, and drying the copper foil, the first copper conductive material and the substrate surface were positioned together, and then subjected to a lamination process which involves applying a pressure of in excess of about 1000 pounds per square inch (psi.) at a temperature in excess of about 330 degrees Celsius for a time in excess of about 60 minutes, most preferably using a pressure of about 1700 psi and a temperature of about 365 degrees Celsius for a time of about 90 minutes. During the lamination process, the copper foil formed a diffusion bond with the first copper conductive material, and simultaneously formed a mechanical and chemical bond with the first external surface (dielectric material) of the substrate. After removing the assembly from the lamination press, the conductor forming the first conductive layer was patterned into a first layer portion by using photo lithographic etching to selectively remove unwanted copper. A similar process, as described above, was used to form a second conductive layer having a first layer portion on an opposing surface of the substrate.

In the above-described process, the lamination diffusion bond is formed between the two copper surfaces, that is between the copper foil (first conductive layer) and first conductive material 110. However, it is possible that various other metals could have been used in place of copper, or in addition to copper. For example, alloys of copper will form with other suitable electronic grade metals such as tin, silver, and gold. In practice, such metals could be used as an additional finishing layer on either or both of the copper surfaces, and thus become alloyed during the lamination process. However, depositing additional metal requires additional processing steps including both plating and lithography, and further may require that precise alignment between the foil and the substrate occurs prior to lamination.

A first dielectric layer 118 is then positioned on first conductive layer 112 and on first opposing surface 102 of substrate 101. First conductive layer 112 can be roughened to enhance adhesion of first dielectric layer 118. When first conductive layer 112 is copper, a chloriting process may be utilized to roughen the copper surface to improve adhesion. The first dielectric layer 118 comprises a dielectric material, which may be fiber or a particulate filled thermoplastic or thermoset polymers such as Dynavia 2000™ available from Shipley-Ronal, Marlborough, Mass. and Asahi APPE PC5103, available from Asahi Chemical Co, Toyko, Japan. The first dielectric layer 118 includes at least one internal side wall 119 defining an aperture 120 in the first dielectric layer. As shown, aperture 120 is a blind via or microvia that can be formed by laser drilling into first dielectric layer 118 directly over unfilled through hole 108 and is preferably, one of a plurality of blind vias or microvias in the first dielectric layer. Alternatively, blind via 120 could be formed photolithographically if first dielectric material 118 is a photoimageable dielectric material.

A second conductive material 122 is then positioned on internal side wall 119 of first dielectric layer 118 and includes a portion positioned on and electrically connected to first layer portion 114 of first conductive layer 112. A suitable method for forming second conductive material 122 is to plate copper on the entire external surface of dielectric layer 118 and on internal side wall 119 of first dielectric layer 118 and then photolithographically etching the copper into the pattern, as described. The second conductive material 122 can function as a semiconductor chip connector pad and as a site for connection of a semiconductor chip and can include a portion of a chip connector member positioned thereon. The chip connector member comprises a controlled collapse chip connector joint, a ball grid array connector joint, or a reflow solder attach connector joint. The second conductive material 122 comprises a metal selected from the group consisting of copper, tin, nickel, gold, silver, and alloys thereof.

The invention, as described in above example has many advantages because it eliminates substantial processing complexity associated with use of a hole fill/plating approach to sealing a through hole in an interconnect structure. For example, it eliminates the use of a hole fill material to completely fill the through hole and subsequent steps to remove excess hole fill material and planarize the surface of the hole fill material and substrate surface. By eliminating the need for plating across the filled through hole, plating solution cannot become trapped in the through hole. Furthermore, there are competing requirements for the hole fill material itself that become increasingly difficult to satisfy for advanced organic chip carriers with small diameter (less than 75 micron) through holes. For example, the hole material must have low viscosity to flow and fill the hole completely, yet in must have low thermal expansion necessitating a high volume fraction of particulate fillers which of course increase the viscosity. Also, the planarization step imparts stress to the structure during the conventional mechanical polishing process that may be damaging to a low stress interconnect structure as embodied in the current invention.

The substrate 100 can further include a metal layer 124 between first opposing surface 102 and second opposing surface 104 and first and second non-conductive layers 126 and 128, respectively. The metal layer 124 preferably comprises a ground plane and is from a metal such as nickel, copper, molybdenum, iron, and alloys thereof. Preferably, the ground plane comprises copper-Invar-copper having a low coefficient of thermal expansion (CTE) of from about 4.0 ppm/ degree Celsius to about 8.0 ppm/degree Celsius. The first non-conductive layer 126 is positioned between first opposing surface 102 and metal layer 124. First non-conductive layer 126 and second non-conductive layer 128 are comprised of a non-cloth dielectric material such as a filled organic polymeric material having an effective modulus from about 0.01 to about 0.50 million pounds per square inch (Mpsi). Preferably, the effective modulus is from about 0.03 to about 0.10 Mpsi. One example of a suitable non-cloth dielectric material is a silica filled polytetrafluoroethylene material available as RO-2800 from Rogers Corporation (Rogers Conn.). The non-cloth dielectric material is material which can deform in an elastic manner under stress, and with sufficient stress can deform in an elastic-plastic manner. The effective modulus is defined as a secant modulus which in turn is defined as a relation of the tensile stress to total strain of an elastic-plastic stress-strain material test stress response curve (see, for example, A. Blake, "Practical Stress Analysis in Engineering Design", Marcel Dekker: 270 Madison Ave., New York, N.Y. 10016, 1982.) It is preferred to employ a non-cloth dielectric material having a measured tensile secant modulus within the range of 0.01 to 0.5 Mpsi, measured at room temperature, with a strain rate between the values of 0.01/min and 0.6/min, with the test conducted at a temperature between about 10 and 30 degrees Celsius. When the first and second non-cloth dielectric layers are comprised of a material with this effective modulus, the interconnect structure is relatively compliant and warpage during operation is greatly reduced. This combination of the low CTE metal layer and the compliant (during operation) non-cloth dielectric layers assures the substantial prevention of failure of the solder connections between the chip connector members of a semiconductor chip and second conductive material 122 and between interconnect structure 100 and a circuitized substrate that the interconnect structure can be subsequently assembled to. As a result, the semiconductor chip will experience much less warpage than would occur with chip carriers made of typical organic materials. The interconnect structure 100 is capable of absorbing a modest amount of internal shear strain under the semiconductor chip. If an encapsulant is applied between the semiconductor chip and the interconnect structure 100, the compliancy of the structure will result in significantly less stress within the encapsulant. The combination of the strain control on the solder connections and the reduced tendency of the electronic package to warp both contribute to preventing failure of the solder connections between second conductive material 122 and the chip connector members.

A third conductive layer 130, a power plane, may also be included within first non-conductive layer 126 and a fourth conductive layer 132 is positioned between the third conductive layer and metal layer 124. The fourth conductive layer 132 comprises a first plurality of controlled impedance signal conductors. A fifth conductive layer 134, another power plane, is included within second non-conductive layer 128 and a sixth conductive layer 136 is positioned between the fifth conductive layer and metal layer 124. The sixth conductive layer 136 comprises a second plurality of controlled impedance signal conductors. An important aspect of this embodiment is that the signal carrying layers 132 and 136 are shielded on either side by an electrically conducting layer which significantly reduces signal noise in the interconnect structure.

Figure 4:
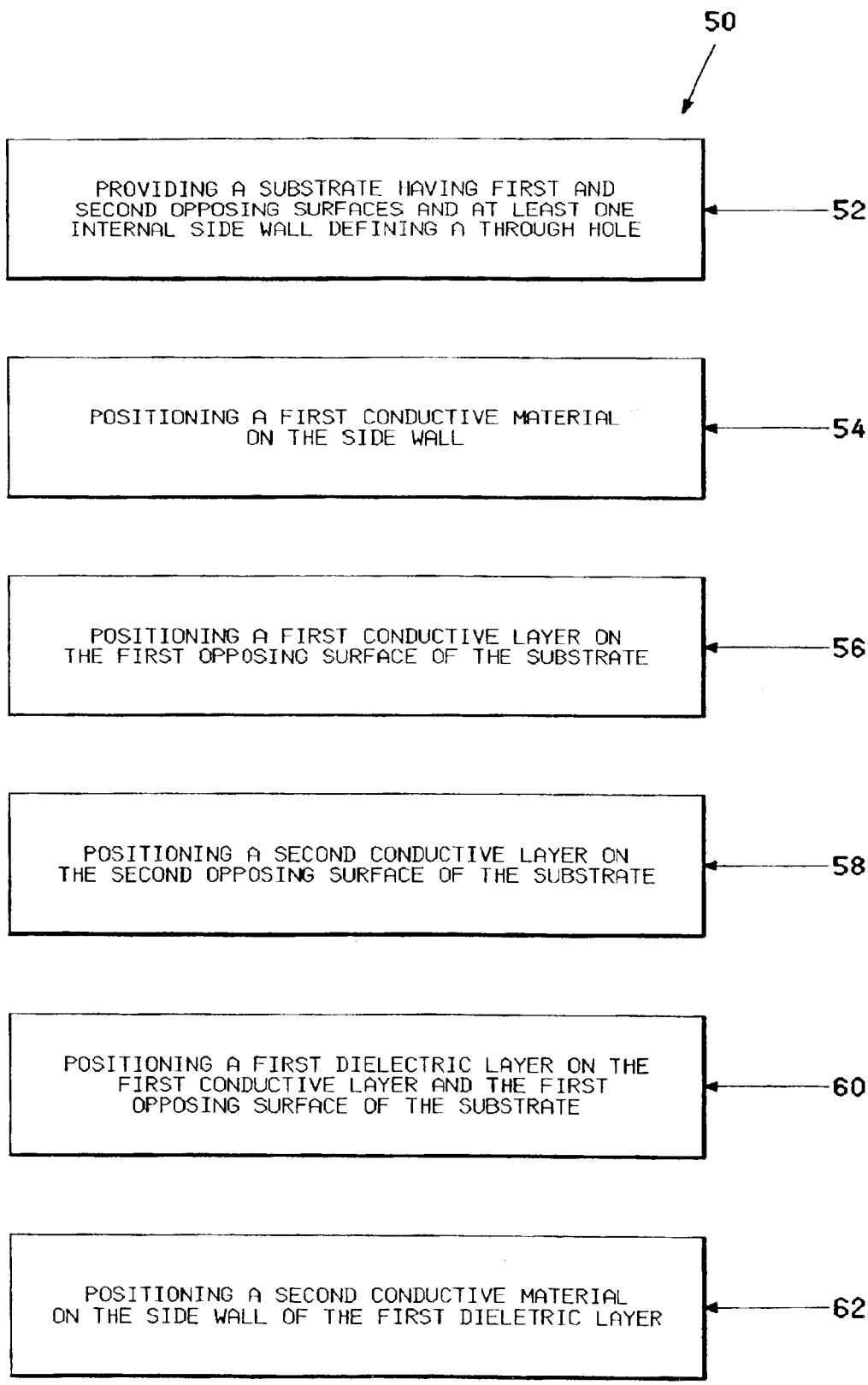
FIG. 4 is a process flow diagram showing the method of making the interconnect structure according to the present invention.

Referring to FIG. 4, a process flow diagram showing a method 50 of making the interconnect structure 100 is shown. The resulting interconnect structure is adapted for electrically interconnecting a semiconductor chip and a circuitized substrate using solder connections. Significantly, the semiconductor chip can be positioned over an unfilled plated through hole and electrically connected directly to the conductive material in a sealed plated through hole. The first step 52 in this method comprises providing a substrate 101 having first and second opposing surfaces 102 and 104, respectively. The interconnect structure 100 has been previously described in detail above and includes at least one internal side wall 106 defining a through hole 108 within substrate 101 extending from first opposing surface 102 to second opposing surface 104. The step of providing substrate 101 further comprises providing the above-described metal layer 124 within substrate 101 between first and second opposing surfaces 102 and 104 of the substrate, respectively, and positioning the above-described first and second non-conductive layers 126 and 128, respectively, between the first opposing surface and the metal layer and between the second opposing surface and the metal layer.

Step 54 includes positioning a first conductive material 110 on internal side wall 106 of substrate 101. The first conductive material on the internal side wall of the substrate can be formed by electrolessly seeding the internal side wall and subsequent plating with a continuous layer of metal. The thickness of the first conductive metal on the internal side wall of the substrate is from about 0.1 mils to about 1.0 mils. The preferred metal is copper and methods of plating copper are well known.

Step 56 includes positioning the above-described first conductive layer 112 on a portion of first opposing surface 102 of substrate 101 by laminating the first conductive layer to the first opposing surface of the substrate at the above-described lamination conditions. The first conductive layer 112 includes a first layer portion 114 positioned over through hole 108 and electrically connected to first conductive material 110 on internal side wall 106 of substrate 101.

Step 58 includes positioning the previously described second conductive layer 122 on a portion of the second opposing surface 104 of substrate 101 by laminating the second conductive layer to the second opposing surface of the substrate at the above-described lamination conditions, the second conductive layer having a first layer portion 117 positioned over through hole 108 and electrically connected to first conductive material 110 on internal side wall 106 of the substrate.

Step 60 includes positioning the above-described first dielectric layer 118 on first conductive layer 112 and first opposing surface 102 of substrate 101 and having at least one internal side wall 119 defining an aperture 120 in the first dielectric layer. The first dielectric layer is positioned using conventional coating processes. The apertures can be formed by a process of mechanically drilling, etching or laser ablating a portion of the first dielectric layer.

Step 62 includes positioning second conductive material 122 on side wall 119 of first dielectric layer 118 and including a portion of the second conductive material positioned on and electrically connected to first layer portion 114 of first conductive layer 112. The second conductive material can be positioned on the side wall by a plating process with a suitable metal, preferably copper. A solder paste or solder ball can be applied to the second conductive material to aid in the attachment of the above-described chip connector member, the preferred solder being a low melt solder, such as eutectic solder. A lead free solder can also be used. An example of a suitable eutectic solder that can be used is Alpha 3060 from Alpha Metals, Jersey City, N.J. The solder balls or solder paste can then be reflowed to produce solder connections.

Figure 1:
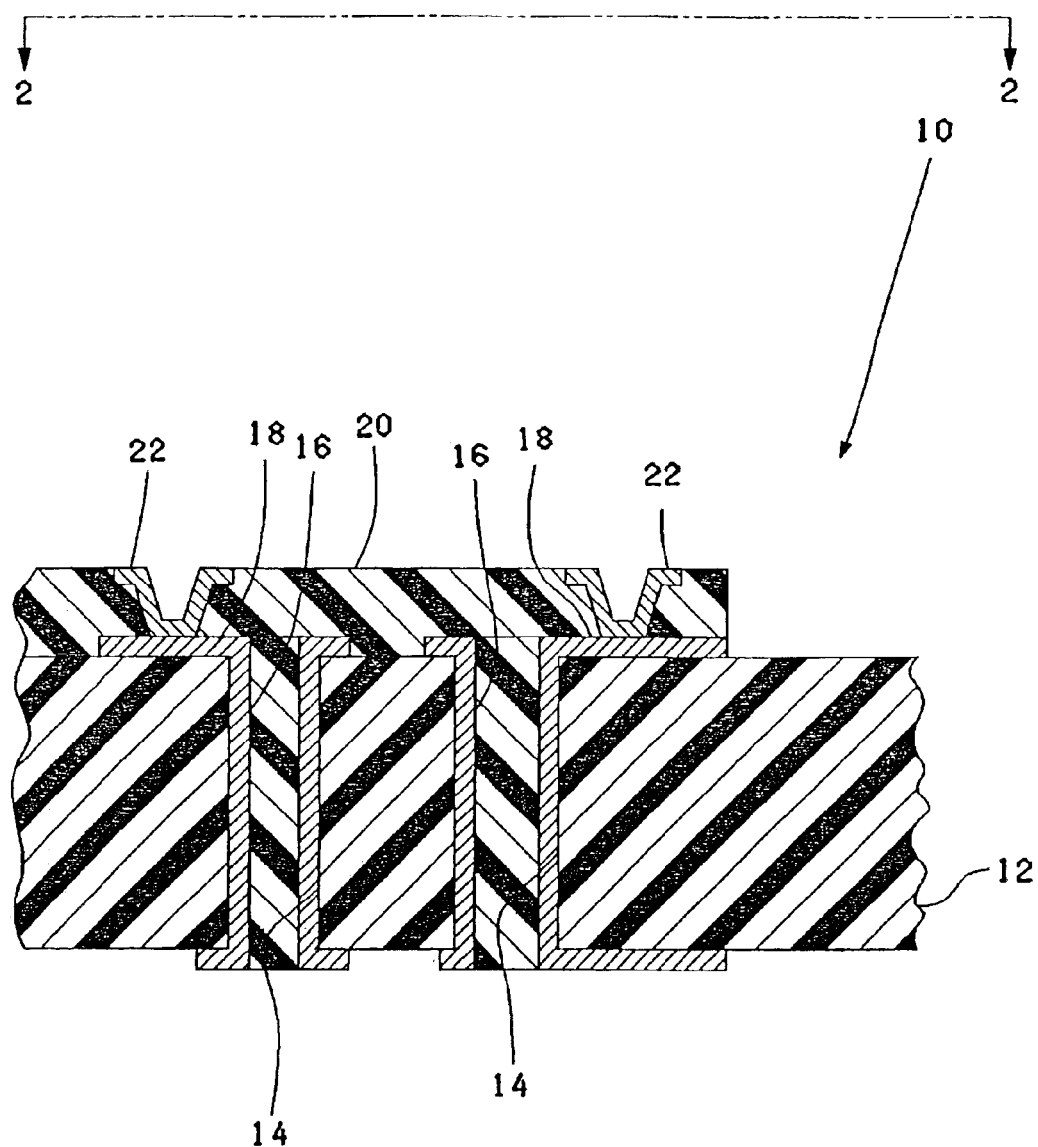
FIG. 1 is a much enlarged view, in elevation, of a known semiconductor chip carrier.
Figure 2:
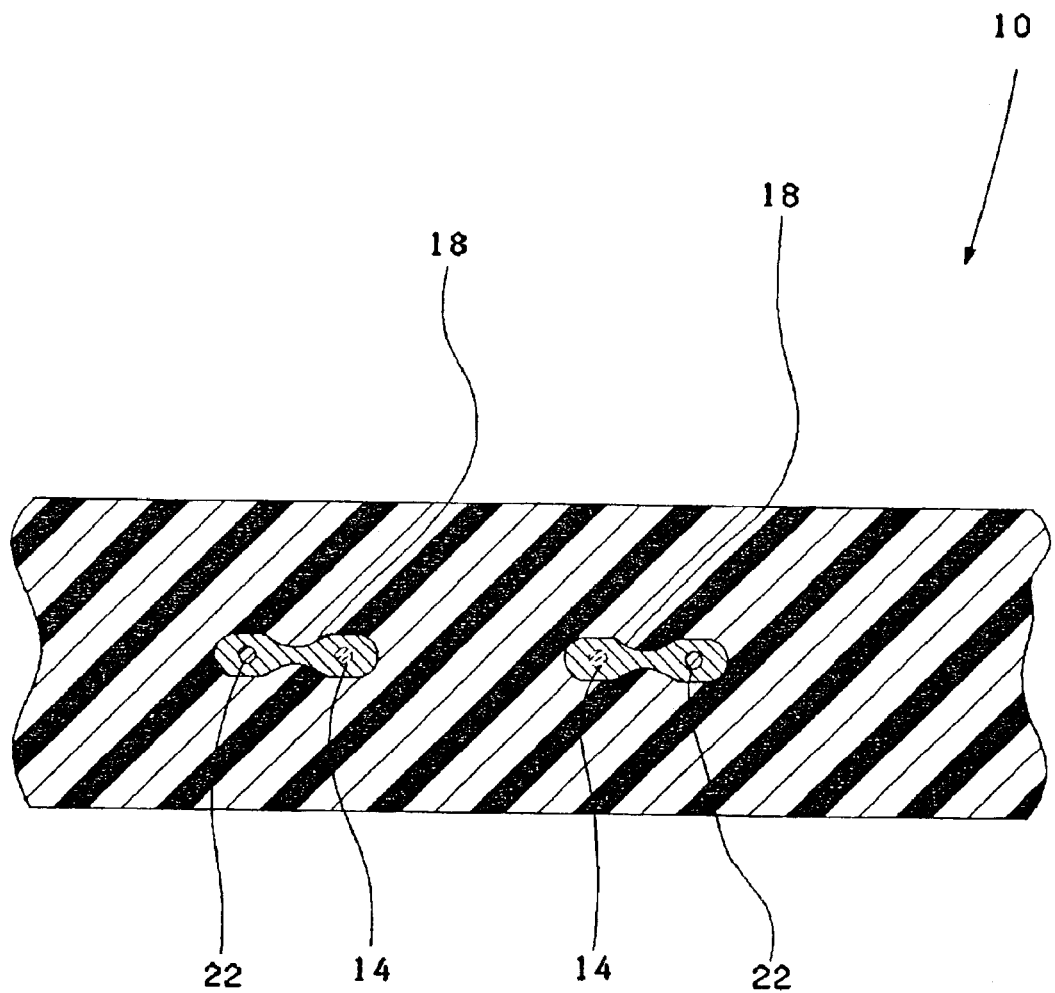
FIG. 2 is a top plan view of a portion of the semiconductor chip carrier taken along the line 2—2 in FIG. 1.

The resulting structure, as depicted in FIG. 3, has several advantageous characteristics. Firstly, first and second layer portions 114 and 117 provide a hermetic seal over plated and unfilled through hole 108, enabling an aperture 120 to be positioned directly atop the plated through hole without requiring the use of a dogbone connection (as shown in FIG. 2), and without the additional process complexity of a plated and filled through hole. This structure provides improved electrical performance due to short connection lengths, and provides a significant improvement in space utilization on the chip carrier surface. In practice, some dogbone connections may be used in combination with the inventive structure to provide optimal wireability. The mechanical properties of first dielectric layer 118 must not only meet the requirements of an external dielectric (to minimize package stress and optimize reliability), but also meet a different set of requirements for mechanical stiffness and thermal expansion so as not to increase stress on the plated though hole connections during temperature excursions. By eliminating the need to fill through holes 108, the composition and processing of first dielectric layer 118 can be optimized for the single purpose of functioning as an external dielectric. A further advantage of the current invention is that there is no precious metal plating required to form the metallurgical connection between first conductive material 110 on side wall 106 of through hole 108 and layer portions 114 and 117 that form the seal over the through hole. In practice, the use of such a metal would require plating and lithography steps, and also precision alignment of the foil to substrate prior to the lamination process, adding substantial cost and complexity to the manufacture of the chip carrier which can be avoided by utilizing the current invention.

What has been shown and described are at present considered the preferred embodiments of this invention, it will be obvious to those skilled in the art that various changes and modifications can be made therein without departing from the scope of the invention as defined by the appended claims.

We claim:

1. A method of forming an interconnect structure comprising the steps of:

providing a substrate having first and second opposing surfaces and at least one internal side wall defining a through hole within said substrate extending from said first opposing surface to said second opposing surface wherein said substrate includes a metal layer between said first and second opposing surfaces and first and second non-conductive layers positioned, respectively, between said first opposing surface and said metal layer and between said second opposing surface and said metal layer;

positioning a third conductive layer substantially within said first non-conductive layer;

positioning a fourth conductive layer within said first non-conductive layer between said third conductive layer and said metal layer;

positioning a first conductive material on said at least one internal side wall of said substrate;

positioning a first conductive layer on a portion of said first surface of said substrate, said first conductive layer having a first layer portion positioned over said through hole and electrically connected to said first conductive material on said internal side wall of said substrate;

positioning a second conductive layer on a portion of said second surface of said substrate, said second conductive layer having a first layer portion positioned over said through hole and electrically connected to said first conductive material on said internal side wall of said substrate;

positioning a first dielectric layer on said first conductive layer and said first opposing surface of said substrate and having at least one internal side wall defining an aperture in said first dielectric layer; and positioning a second conductive material on said internal side wall of said first dielectric layer and including a portion of said second conductive material positioned on and electrically connected to said first layer portion of said first conductive layer.

2. The method of claim 1, wherein said step of positioning said first conductive layer on a portion of said first opposing surface of said substrate is accomplished by laminating said first conductive layer to said first opposing surface of said substrate, thereby sealing said first layer portion of said first conductive layer to said first conductive material on said internal side wall of said substrate.

3. The method of claim 1, wherein said step of positioning said second conductive layer on a portion of said second opposing surface of said substrate is accomplished by laminating said second conductive layer to said second opposing surface of said substrate, thereby sealing said first layer portion of said second conductive layer to said first conductive material on said internal side wall of said substrate.

* * * * *